United States Patent [19]
Cowell et al.

[11] Patent Number: 5,268,068
[45] Date of Patent: Dec. 7, 1993

[54] HIGH ASPECT RATIO MOLYBDENUM COMPOSITE MASK METHOD

[75] Inventors: Donald R. Cowell, Wappingers Falls; Mark W. Jones, Hyde Park; Chang-Ching Kin; John J. Nahlik, both of Poughkeepsie; John A. Trumpetto, Hopewell Junction, all of N.Y.

[73] Assignee: International Business Machines Corporation, Armonk, N.Y.

[21] Appl. No.: 987,973

[22] Filed: Dec. 8, 1992

[51] Int. Cl.$^5$ .......................... B44C 1/22; C23F 1/00
[52] U.S. Cl. .................... 156/644; 156/643; 156/656; 156/661.1
[58] Field of Search ............ 156/643, 644, 656, 659.1, 156/661.1; 430/5; 428/134, 137; 427/569, 234, 239, 247; 205/70, 131, 150

[56] References Cited

U.S. PATENT DOCUMENTS

| | | | |
|---|---|---|---|
| 2,226,381 | 12/1940 | Norris | 156/644 X |
| 2,226,384 | 12/1940 | Norris | 156/644 X |
| 3,476,658 | 11/1969 | Corwin | 204/11 |
| 3,862,018 | 1/1975 | Mentone | 204/32 |
| 4,603,056 | 7/1986 | MacKinnon et al. | 427/38 |
| 4,818,661 | 4/1989 | Taylor et al. | 430/320 |

OTHER PUBLICATIONS

IBM Technical Disclosure Bulletin, vol. 18, No. 9, Feb. 1976, "Dimensionally Stable, Metal Mask Fabrication Process", by J. Crimi, et al.
IBM Technical Disclosure Bulletin, vol. 31, No. 6, Nov. 1988, "Method for Laser Etching a Composite Mask," by R. Hodgson, et al.
IBM Technical Disclosure Bulletin, vol. 25, No. 3B, Aug. 1982, "Metal Mask Replacement and Improvement," by R. Feder, et al.
IBM Research Disclosure, May 1990, N. 313, "RIE Made Molybdenum Mask," by C. C. Kin, et al.

*Primary Examiner*—William A. Powell
*Attorney, Agent, or Firm*—Kris V. Srikrishnan; Harold Huberfeld

[57] ABSTRACT

An improved metal mask-making process is disclosed which involves starting with a metal mask having etched apertures using existing processes and coating it conformably with a substantially thick layer, so as to reduce the minimum aperture size while increasing the metal mask thickness. The conformal layer is chosen for minimum stress, good adhesion and thermal compatibility to the original metal mask material. Additional thin conformal coatings can be provided for imparting mechanical and chemical resistance to the metal mask.

3 Claims, 2 Drawing Sheets

HIGH ASPECT RATIO MOLYBDENUM COMPOSITE MASK METHOD

FIELD OF INVENTION

The present invention relates generally to the manufacture of semiconductor electronic devices and more particularly to metal masks used for forming features on substrates in electronic manufacturing.

BACKGROUND INFORMATION

Metal masks are formed by etching apertures or openings that correspond to a specific pattern on a metal sheet or foil. In a commonly used metal mask fabrication process, photolithography is used to form resist patterns on the metal workpiece on one or both sides of the metal piece, and apertures are formed by subtractive etching using the resist stencil(s) as a mask. The use of metal masks in electronics manufacturing is primarily for forming metallization features. In one use, the mask is placed adjacent to a substrate and the material of interest is evaporated, ion plated or electroplated through the openings in the mask. Another use is for screening paste, containing metallic particles, onto substrates. In the screening process, the metal mask is held against a substrate and a paste type material, which is usually finely ground metallic particles mixed with an organic binder, is squeezed through the openings of the metal mask. The metal mask is subsequently removed, thereby leaving a pattern of paste on the substrate corresponding to the metal mask pattern. The screened paste is heated to convert it into a conducting film.

Wet etching, using a resist stencil pattern, is the most widely used technique for forming metal masks. Other techniques such as electroforming, reactive etching and laser assisted etching have also been discussed as having some advantages for fabricating metal masks. In electronic applications, there is a continuous need to shrink the size of the minimum feature (aperture) that can be etched into the metal mask. This is true whether the application involves the use of evaporation or screening through the metal mask. In addition, a further requirement on the metal mask is the need for structural rigidity to withstand the handling in use so that the masks can be used several times. It is well known that metal masks made of very thin material are prone to bending and other forms of damage, which reduce their useful life. Therefore, most metal masks have a certain minimum thickness, depending on the application and size which is usually in thousands of an inch (mils). The widely used metals for metal mask fabrication are the following: molybdenum, tungsten, copper and nickel as individual layers or in a cladded form as a double layer. The choice has been due to their availability in preferred forms such as sheets or cladded layers and their amenability to electroforming and etching processes. Molybdenum, for example, is preferred for its structural rigidity and ease of obtaining in rolled sheet form with tightly controlled thickness.

In a technique using multilayer metal foils, Crimi, et al. (Crimi, J. S., et al., "Dimensionally Stable Metal Mask Fabrication Process," IBM Technical Disclosure Bulletin, Feb. 1976, pp. 3069-3070) describes a process in which a copper foil is plated with nickel on both sides followed by forming resist stencil patterns by known methods. In the Crimi, et al., process, the nickel layers are etched first using etchants selective to copper followed by etching copper using etchants selective to nickel. Thus, the Crimi, et al., process achieves a dimensionally stable process. Hodgson, et al. (Hodgson, R. T., et al., "Method for Laser Etching a Composite Mask," IBM Technical Disclosure Bulletin, Nov. 1988, pp. 5-6) discloses a process for laser etching of a composite mask, wherein the cladded Cu-Ni layers are etched in reactive gas species by irradiating with an excimer laser. This avoids the wet etching employed in the Crimi, et al., process, thereby avoiding undercuts in the mask etching profile. Etch profile refers to the etched contour of the aperture surface. This is discussed in more detail later. Another process by Kin, et al. (Kin, C. C., "RIE Made Molybdenum Mask," IBM Research Disclosure, May 1990, p. 313) achieves fine apertures in a metal mask by using reactive ion etching (RIE) of a molybdenum metal foil, coated with a RIE resistant layer, such as copper or nickel. In Kin, et al., process, pattern on the etch stop top layer was defined by wet etching, etching of molybdenum was carried out using $CF_4/O_2$ or $SF_6/O_2$ gas plasma. Since the mask stock thickness is in hundreds of microns, the RIE process takes a long time in hours and is not easily manufacturable.

In the wet etch molybdenum metal mask process in order to achieve the smallest feature, the metal stock is usually etched from both sides by directional spraying to keep the isotropic (non-directional) etching component to a minimum. In wet etching, because of the isotropic nature of etching, the undercut with respect to a feature is of the same order of the thickness etched. To a first approximation, the etched diameter is equal to the resist feature diameter plus two times the depth of etching. The resist feature diameter for practical reasons has to be kept to some minimum value and not zero. The choice of etching from both directions keeps the thickness to etch roughly half the thickness of the metal stock. Thus to a first order approximation, the minimum feature size is equal to the thickness of the metal stock. The thickness of molybdenum sheet chosen for adequate handling strength has been 3 to 5 mils. Based on the above discussions, it can be seen that the realistically achievable limit of the mask aspect ratio in wet etching is roughly 1 (mask aspect ratio is defined as the ratio of the thickness of mask to minimum feature size).

OBJECTS OF THE INVENTION

An object of the present invention is the provision of a metal mask having an aspect ratio substantially higher than 1.

Another object of the invention is the provision of a method for manufacturing a metal mask which adds few additional steps to widely practiced metal mask fabrication processes in achieving its objective.

A further object of the present invention is the provision of a process for forming apertures in a metal mask smaller than the present limit set by wet etching.

A still further object of the present invention is the provision of a metal mask with the same or increased mechanical rigidity of prior mask while achieving a smaller or same aperture size.

SUMMARY OF THE INVENTION

An improved metal mask-making process is disclosed which involves starting with a metal mask with apertures etched, using existing processes and coating it conformably with a layer of substantial thickness, so as to reduce the minimum aperture size while increasing the thickness of the metal mask. The conformal layer is chosen for minimum stress, good adhesion and thermal compatibility to the original metal mask material. Additional thin conformal coatings can be provided over the primary conformal layer for imparting mechanical and chemical resistance to the metal mask.

BRIEF DESCRIPTION OF THE DRAWINGS

The objects, features and advantages of the invention will be apparent from the following more particular description of the invention illustrated in the accompanying drawings, in which.

DETAILED DESCRIPTION OF THE INVENTION

Figure 1A:
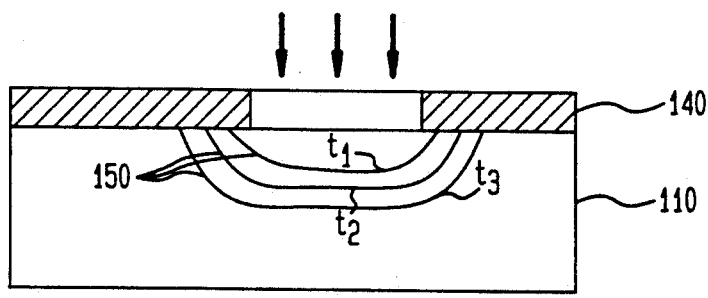
FIG. 1A shows the progression of wet etching the metal using a resist mask.
Figure 1B:
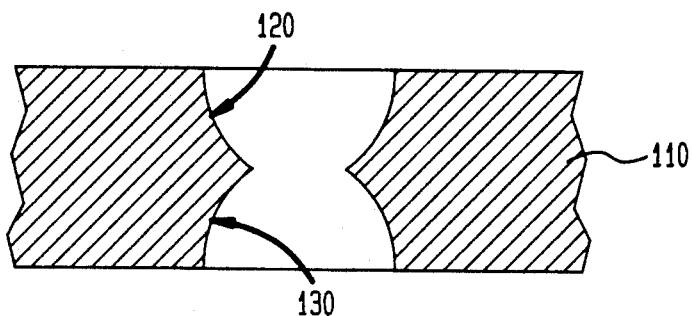
FIG. 1B shows a profile of an aperture etched simultaneously from both sides of a metal mask.

Referring to FIG. 1A, a resist pattern 140 defines an area of metal mask 110 which is being etched. The etch surface profile 150 progressively undercuts the resist opening with increasing etch times t1, t2 and t3, showing that the etched dimension progressively becomes larger as a result of the isotropic etching (equal etching in all directions). In spray etching where the wet etchant is sprayed onto the masked surface, the isotropic etching is minimized, but there is still considerable sidewise etching. FIG. 1B shows a resultant aperture profile, which is the intersection of etch surface profiles 120 and 130, corresponding to etching from top and bottom surfaces. The narrowest portion of the aperture is usually present approximately in the middle of the metal thickness and correspond to the intersection of two wet etching profiles.

Figure 2A:
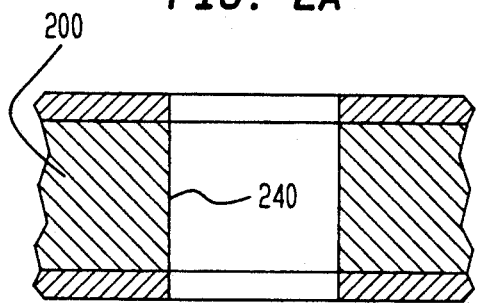
FIGS. 2A, 2B and 2C illustrates resulting aperture profile corresponding to different metal mask fabrication process.
Figure 2B:
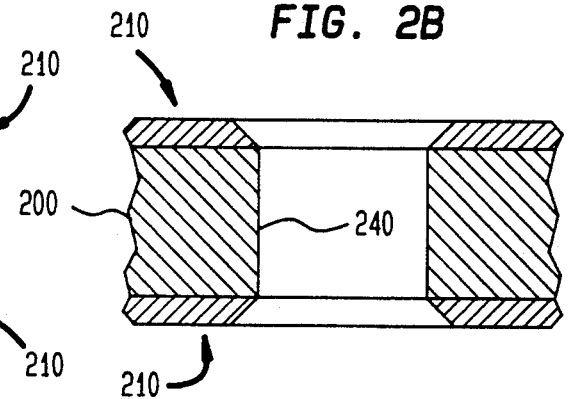
Figure 2C:
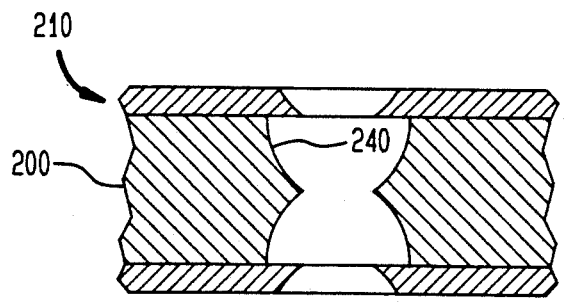

FIGS. 2A, 2B and 2C show how the different processes used in metal mask fabrication give rise to different profiles 240 in a three layer cladded metal mask (layers 200, 210). FIG. 2A corresponds to laser assisted RIE etching of the three layer mask structure by Hodgson, et al., FIG. 2B corresponds to RIE etching/wet etching of etch stop process by Kin, et al., and FIG. 2C corresponds to the wet etch/wet etch process by Crimi, et al. The purpose of illustrating these is to show that, depending on the specific processes used, somewhat different aperture profiles are obtained. The objective of the invention is to provide a solution that is applicable to all different processes used to make apertures in metal masks, to achieve a smaller feature size and thicker mask with minimal additional processing.

Figure 3:
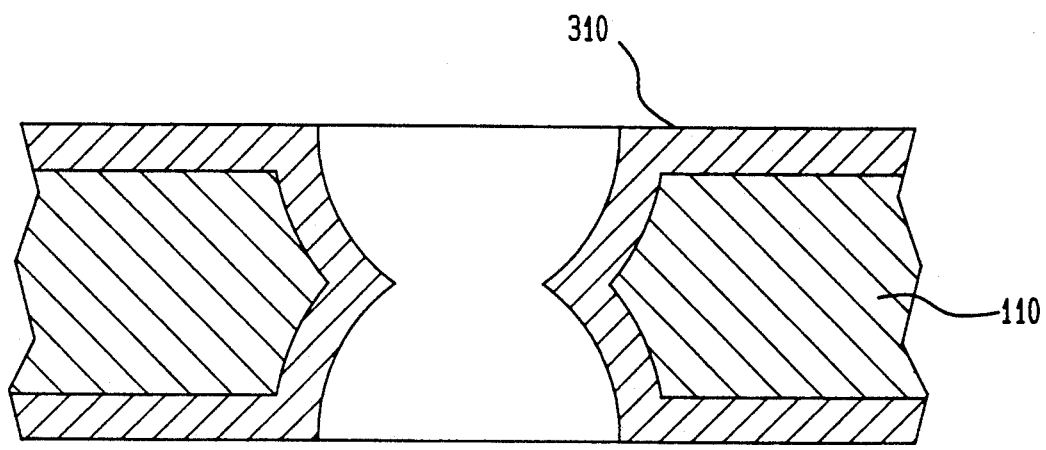
FIG. 3 is a cross section of the same mask shown in FIG. 1 over which a substantially thick conformal overlayer has been coated.

FIG. 3 illustrates the salient feature of the invention. Starting with a mask obtained by any of the prior art, a thick low stress conformal layer is added to all surfaces of the metal mask. The specific cross section shown in FIG. 3 corresponds to the coated cross section of FIG. 1. However, it is easy to visualize this conformal coating over different mask profiles, essentially achieving the same final results. The benefit of the coating becomes apparent on examining what happens to the aperture opening size and to the mask thickness. If the aperture opening is "d", then the new aperture opening after a coating of thickness "t" is approximately "d−2t." If the metal stock thickness is "T," then the new metal stock thickness after the conformal coating is "T+2t." The mask aspect ratio, which was T/d, has been changed to (T+2t)/(d−2t). For any non-zero value of t, the aspect ratio has become higher. It is easily recognized that the coating can be restricted to the aperture surface and one side of the mask. Specifically, as was mentioned earlier, the metal mask thickness required for providing sufficient rigidity for handling is in the range of 100 microns. Thus to get significant gains in reducing the feature size and increasing the mask thickness, the thickness of the coating should be several microns thick.

It is important that the coating process/material should meet at least the following requirements. It must have good adhesion to the metal stock onto which it is plated. The deposition should be as conformal as possible, which means that the thickness of the deposited layer is approximately equal over all surfaces, the top and bottom surfaces of the mask and the sidewalls of the apertures. Several known process techniques can be used to get thick conformal coatings, such as electroplating, chemical vapor deposition, plasma enhanced chemical vapor deposition, etc. Film stress becomes a key concern as the thickness of the films are substantial in terms of thin films and failure of coatings due to high stresses become a serious reality.

U.S. Pat. No. 4,603,056 to MacKinnon, et al., describes a conformal coating on a molybdenum metal mask, consisting of a dual layer of molybdenum nitride of 250 Å thick, followed by a layer of silicon nitride deposited by PECVD in the range of 1500 Å to 4000 Å. The purpose of the first layer is to promote adhesion, and the second layer is to impart some surface hardness to the metal mask. As per our earlier discussion, thickness in the range specified by the above patent will not impart any significant benefit in reducing the feature size of the apertures. Further, these hard layers have high intrinsic film stresses (usually greater than $1 \times 10^9$ dynes/cm2) and have no mechanism for relieving the stress. In general, films of this nature in substantial thickness tend to delaminate at the interfaces and, therefore, must be kept thin and cannot be used to realize the present invention. A key feature of this invention is to fabricate this conformal layer by using layers that have low stress and have stress relaxation mechanisms, such as grain growth, that limit the build up of stresses during use related thermal cycling. Accordingly, the present invention envisions the use of metals, such as copper, nickel, gold, platinum, palladium, etc., that can be deposited conformably and have low stress and can relieve built-up stresses.

PREFERRED EMBODIMENT OF THE INVENTION

Following is an example of a preferred embodiment of the present invention:

A metal mask, using molybdenum stock of 3 mil thick, was wet etched from both sides, using a resist pattern containing a minimum 3.5 mil via feature. After the spray etching process, the via size was measured to be 5.6 mils. This wet etch process, using present dimensions, gave a mask aspect ratio of approximately 0.6.

Subsequently, the mask is furnace cleaned in hydrogen ambient with the furnace temperature at 885° C., and the molybdenum mask was placed flat by means of spacers at each of the corners below and above. The mask was heated for roughly for 1 hour and cooled down for 1 hour. By means of a suitable plating bath, 0.1 mil thick nickel film was plated onto the mask supported in a suitable rack, passing 15 amps of current. The mask was rinsed in distilled water and dried. The preplated Ni was diffused into molybdenum, by heating in a hydrogen ambient furnace at 700° C. for 1 hour followed by a 1 hour cool down. This treatment prepared the surface for good adhesion of the subsequent thick nickel deposition. A 1 mil thick nickel layer was deposited, followed by cleaning and drying of the metal mask. The mask was inspected, the via size was measured to be 3.6 mils, and the metal thickness was measured to be 5.0 mils. The mask aspect ratio thus has been increased from 0.6 to 1.4.

The preferred embodiment describes a most straightforward application of the present concept and other variations, such as forming an additional thin conformal layer to impart mechanical (hardness) and chemical resistant properties, is easily envisioned. This thin conformal layer can be titanium nitride, silicon nitride, carbon or teflon type of film depending on the objectives. Further, conformal layers can be made of combination of different layers for compensation of stress and thermal mismatch.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A process of making metal mask with very small apertures comprising the steps of:

forming the apertures to a first predetermined size in said body of the metal mask by a process selected from a group consisting of wet etching, reactive ion etching and electroforming; and coating at least one of the top and bottom surfaces of said metal mask and the sidewall surfaces of said apertures, with a predetermined thickness of a conformal layer, thereby increasing the thickness of said metal mask and decreasing the size of said apertures to a second predetermined size.

2. The metal mask-making process of claim 1, further comprising the steps of:

coating the conformally coated layer with an additional thin conformal layer for imparting mechanical and chemical resistance properties.

3. The metal mask-making process of claim 1, wherein the coating of the conformal process is performed by one of the processes selected from the group consisting of plating, chemical vapor deposition, and plasma enhanced chemical vapor deposition.

* * * * *